(12) United States Patent
Muhammad

(10) Patent No.: US 9,059,721 B2
(45) Date of Patent: Jun. 16, 2015

(54) ELECTRONIC DEVICE INCLUDING VOLTAGE CONTROLLED OSCILLATOR PULLING COMPENSATION CIRCUIT AND RELATED METHODS

(75) Inventor: Khurram Muhammad, Irving, TX (US)

(73) Assignee: BLACKBERRY LIMITED, Waterloo, Ontario (CA)

( * ) Notice: Subject to any disclaimer, the term of this patent is extended or adjusted under 35 U.S.C. 154(b) by 978 days.

(21) Appl. No.: 13/005,371

(22) Filed: Jan. 12, 2011

(65) Prior Publication Data

US 2012/0177157 A1 Jul. 12, 2012

(51) Int. Cl.
*H03L 7/099* (2006.01)
*H03L 7/18* (2006.01)

(52) U.S. Cl.
CPC *H03L 7/099* (2013.01); *H03L 7/18* (2013.01); *H03L 2207/06* (2013.01)

(58) Field of Classification Search
CPC ........ H03L 7/099; H03L 7/18; H03L 2207/06
USPC ............... 375/219; 455/73, 84; 327/146, 147, 327/155, 156
See application file for complete search history.

(56) References Cited

U.S. PATENT DOCUMENTS

| 5,381,108 | A | 1/1995 | Whitmarsh et al. ............... 330/2 |
|---|---|---|---|
| 6,078,628 | A | 6/2000 | Griffith et al. ................. 375/300 |
| 6,665,339 | B1 | 12/2003 | Adams et al. |
| 6,862,313 | B2 * | 3/2005 | Walley et al. ................. 375/141 |
| 6,987,954 | B2 | 1/2006 | Nielsen ........................ 455/114.3 |
| 7,482,852 | B1 | 1/2009 | Samavati ........................ 327/359 |
| 7,620,373 | B2 | 11/2009 | Cole et al. ......................... 455/73 |
| 7,715,836 | B2 | 5/2010 | Vassiliou et al. ............... 455/423 |
| 7,725,087 | B2 | 5/2010 | Nielsen ....................... 455/114.3 |
| 7,809,338 | B2 * | 10/2010 | Tsfati .............................. 455/76 |

(Continued)

OTHER PUBLICATIONS

Eliezer, Oren. "Mitigation of Self-Interference in Mixed-Signal Transceiver SoCs", Wireless Terminals Business Unit, Texas Instruments Inc., IEEE, Dec. 3, 2008, 78 pgs.*

(Continued)

*Primary Examiner* — Daniel Washburn
*Assistant Examiner* — Eboni Hughes
(74) *Attorney, Agent, or Firm* — Guntin & Gust, PLC; Andrew Gust

(57) ABSTRACT

An electronic device includes an input configured to receive at least one baseband input signal and at least one mixer downstream from the input. The electronic device also includes a phase-locked loop (PLL) including a voltage controlled oscillator (VCO) and a phase detector coupled thereto, the VCO coupled to the at least one mixer. A power amplifier is downstream from the at least one mixer and generates at least one aggressing signal that would otherwise generate an output pull of the VCO. The electronic device also includes a VCO pulling compensation circuit coupled to the input and the VCO and configured to compensate the VCO for the output pull based upon the at least one baseband input signal and the at least one aggressing signal.

19 Claims, 5 Drawing Sheets

(56) References Cited

U.S. PATENT DOCUMENTS

| | | | | |
|---|---|---|---|---|
| 2002/0015450 | A1 | 2/2002 | Ratto | 375/261 |
| 2003/0045249 | A1 | 3/2003 | Nielsen | 455/118 |
| 2006/0128324 | A1 | 6/2006 | Tan et al. | 455/127.1 |
| 2008/0171522 | A1 | 7/2008 | Ben-Ayun | 455/126 |
| 2009/0258612 | A1* | 10/2009 | Zhuang et al. | 455/110 |
| 2009/0262861 | A1 | 10/2009 | Nielsen | 375/296 |
| 2009/0268791 | A1* | 10/2009 | Waheed et al. | 375/219 |
| 2010/0119012 | A1 | 5/2010 | Pal | 375/324 |
| 2010/0233971 | A1* | 9/2010 | Vassiliou et al. | 455/73 |
| 2010/0233974 | A1 | 9/2010 | Nielsen | 455/114.3 |
| 2010/0283665 | A1 | 11/2010 | Bashir et al. | 342/174 |
| 2010/0315136 | A1* | 12/2010 | Yamabana et al. | 327/156 |

OTHER PUBLICATIONS

Bashir et al., "An Edge Transmitter With Mitigation of Oscillator Pulling", IEEE, May 1, 2010, pp. 13-16.

Windisch et al., Adaptive I/Q Imbalance Compensation in Low-IF Transmitter Architectures, Sep. 2004, pp. 1-5.

Debaillie et al., Calibration of Direct-Conversion Transceivers, Jun. 2009, pp. 488-498.

* cited by examiner

ELECTRONIC DEVICE INCLUDING VOLTAGE CONTROLLED OSCILLATOR PULLING COMPENSATION CIRCUIT AND RELATED METHODS

TECHNICAL FIELD

The present disclosure relates to the field of electronics, and, more particularly to electronic devices including a voltage controlled oscillator.

BACKGROUND

Mobile wireless communications systems continue to grow in popularity and have become an integral part of both personal and business communications. For example, cellular telephones allow users to place and receive voice calls almost anywhere they travel. Moreover, as cellular telephone technology has increased, so too has the functionality of cellular devices and the different types of devices available to users. For example, many cellular devices now incorporate personal digital assistant (PDA) features such as calendars, address books, task lists, etc. Moreover, such multi-function devices may also allow users to wirelessly send and receive electronic mail (email) messages and access the Internet via a cellular network and/or a wireless local area network (WLAN), for example.

Even so, as the functionality of cellular communications devices continues to increase, so too does the demand for smaller devices which are easier and more convenient for users to carry. One challenge this poses for cellular device manufacturers is designing communications circuitry, including, for example, an RF transmitter, for operational and performance stability at increased power outputs within the relatively limited amount of space available for the communications circuitry.

DETAILED DESCRIPTION

Figure 1:
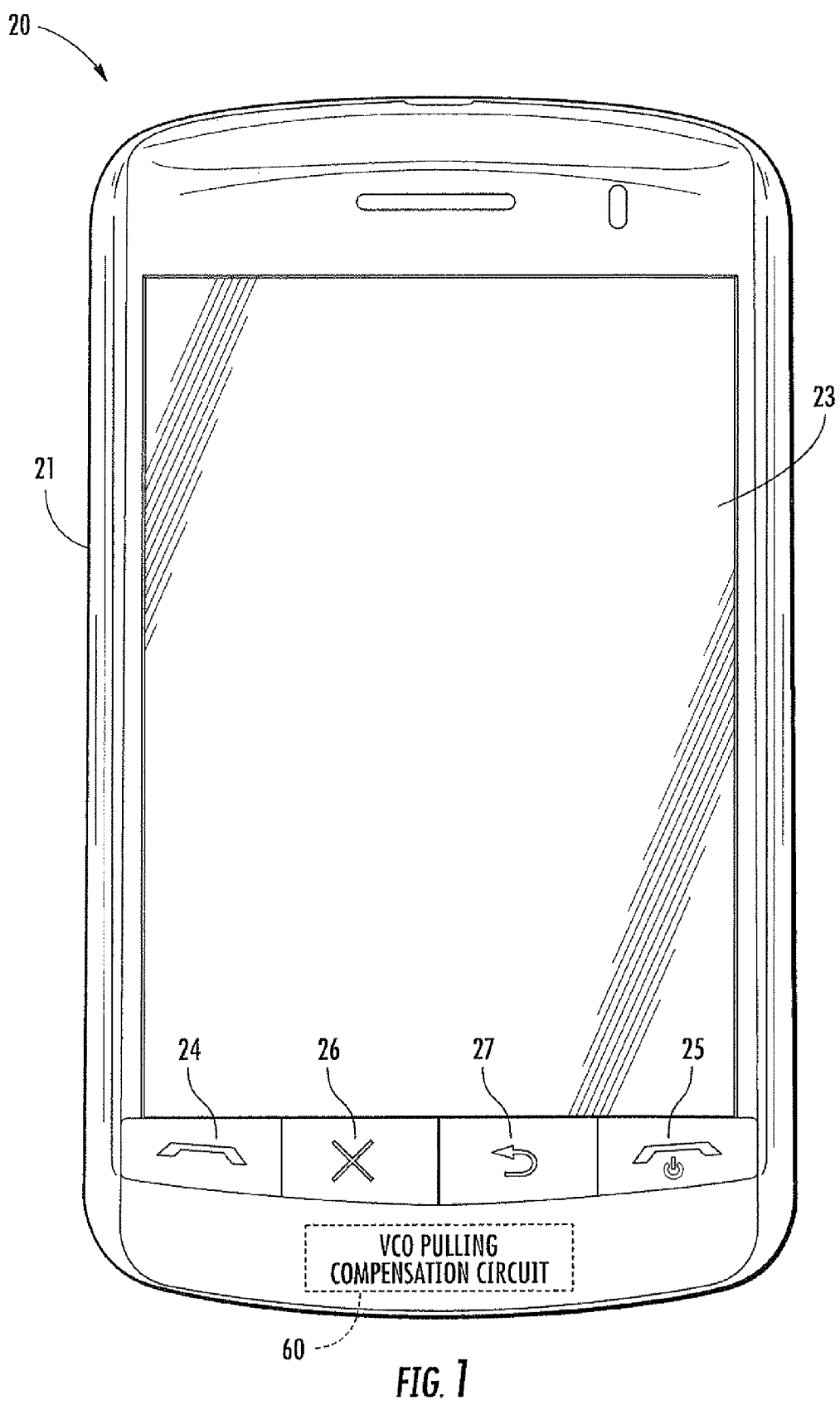
FIG. 1 is a perspective view of an electronic device including a VCO pulling compensation circuit in accordance with one exemplary aspect.

The present description is made with reference to the accompanying drawings, in which various embodiments are shown. However, many different embodiments may be used, and thus the description should not be construed as limited to the embodiments set forth herein. Rather, these embodiments are provided so that this disclosure will be thorough and complete. Like numbers refer to like elements throughout, and prime notation is used to indicate similar elements or steps in alternative embodiments.

In accordance with an exemplary aspect, an electronic device may include an input configured to receive at least one baseband input signal and at least one mixer downstream from the input. The electronic device may include a phase-locked loop (PLL) including a voltage controlled oscillator (VCO) and a phase detector coupled thereto, for example. The VCO may be coupled to the at least one mixer. The electronic device may also include at least one power amplifier downstream from the at least one mixer and generating at least one aggressing signal that would otherwise generate an output pull of the VCO, for example. The electronic device may also include a VCO pulling compensation circuit coupled to the input and the VCO and configured to compensate the VCO for the output pull based upon the at least one baseband input signal and the at least one aggressing signal.

The VCO pulling compensation circuit may be configured to generate a VCO compensation signal at a signal input of the VCO, for example. The VCO pulling compensation circuit may be configured to generate a VCO compensation signal at a power input of the VCO. The VCO pulling compensation circuit may be configured to compensate the VCO for the output pull when the at least one baseband input signal has an envelope greater than a threshold, for example.

The VCO pulling compensation circuit may include a controller and a digital-to-analog converter (DAC) coupled thereto. The VCO pulling compensation circuit may further include a summer coupled to the DAC and the phase detector, for example.

The VCO pulling compensation circuit may further include a memory coupled to the controller and configured to store a VCO pulling compensation table of compensation values corresponding to a given aggressing signal. The VCO pulling compensation circuit may also further include a filter and an attenuator coupled thereto between the controller and the VCO, for example.

The VCO pulling compensation circuit may be configured to sample the at least one aggressing signal at a signal input of the VCO, for example. The PLL further may include a fractional divider coupled between an output of the VCO and the phase detector, and a low-pass filter coupled between the phase detector and the VCO.

A method aspect is directed to a method of compensating for an output pull of a VCO of an electronic device that may include an input configured to receive at least one baseband input signal, at least one mixer downstream from the input, and a PLL including the VCO and a phase detector coupled thereto. The VCO may be coupled to the at least one mixer. The electronic device may include at least one power amplifier downstream from the at least one mixer and generate at least one aggressing signal that would otherwise generate an output pull of the VCO, for example. The method may include using a VCO pulling compensation circuit coupled to the input and the VCO to compensate the VCO for the output pull based upon the at least one baseband input signal and the at least one aggressing signal.

Figure 2:
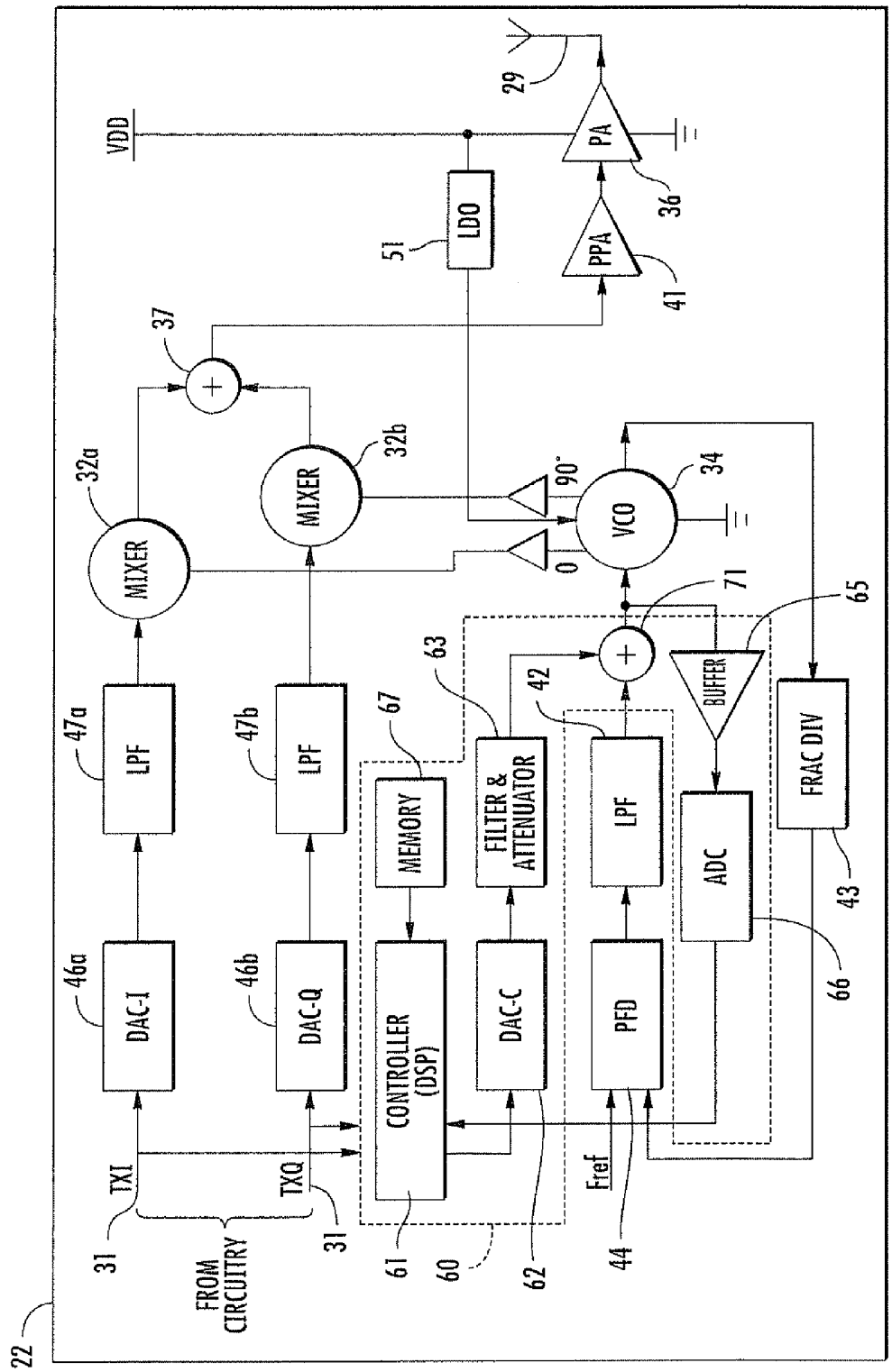
FIG. 2 is a schematic block diagram of a portion of the electronic device of FIG. 1.

Referring initially to FIGS. 1-2, an electronic device 20, which may be, for example, a mobile wireless communications device, and in particular a cellular communications device, illustratively includes a portable housing 21, a printed circuit board (PCB) 22 carried by the portable housing. In some embodiments, not shown, the PCB 22 may be replaced by or used in conjunction with a metal chassis or other substrate. The PCB 22 may also include a conductive layer defining a ground plane (not shown).

The exemplary electronic device 20 further illustratively includes a display 23 and a plurality of control keys including an "off hook" (i.e., initiate phone call) key 24, an "on hook" (i.e., discontinue phone call) key 25, a menu key 26, and a return or escape key 27. Operation of the various device components and input keys, etc., will be described further below with reference to FIG. 5.

The electronic device 20 further illustratively includes an antenna 29 carried the portable housing 21. The electronic device 20 illustratively includes an input 31 configured to receive at least one baseband input signal. The baseband signal illustratively includes the in-phase (I) and quadrature (Q) transmit signals TXI, TXQ received at the input 31. As will be appreciated by those skilled in the art, a transmitter generally supports digital compensation for analog impairments in the analog transmit path. Illustratively, the analog path includes digital-to-analog converters (DAC) 46a, 46b for each of the T and Q signal paths. A respective low pass filter 47a, 47b is coupled to each of the DACs 46a, 46b.

The electronic device 20 also includes two mixers 32a, 32b downstream from the input 31. The mixers 32a, 32b may each be an up-converting mixer, for example.

The electronic device 20 also includes a phase-locked loop (PLL) configured to a desired transmit channel. The PLL illustratively includes a voltage controlled oscillator (VCO) 34 coupled to each of the mixers 32a, 32b so that they are driven to a desired transmit channel, for example. The PLL also illustratively includes a fractional divider 43 coupled to an output of the VCO 34, a phase/frequency detector (PFD) 44 coupled to the fractional divider, and a loop filter or low pass filter 42 coupled to an output of the fractional divider. The PFD 44 produces a positive voltage which may increase the output frequency when the VCO output is lower than the desired output frequency and vice versa. This may be done by comparing the VCO divided output from the fractional divider 43 to a frequency reference signal $F_{ref}$ and producing a control voltage (error signal) that is filtered by the low pass filter 42 to remove noise. The PFD 44 generates a voltage signal that is generally proportional to the difference between the reference frequency and the frequency at the output of the fractional divider 43. The control voltage may regulate the voltage control of the VCO 34 to drive the error signal to zero, for example.

The characteristics of the VCO 34 are such that both the input and the power supply of the VCO changes the output frequency. A typical cross coupled LC tank based low phase noise VCO provides input control that selects the center frequency and bias control that selects the tail current. The transfer function from the voltage input of the VCO 34 to the output frequency is governed by $K_{VCO}/s$ where $K_{VCO}$ determines the change in output frequency per Volt of change in the input signal. The transfer function from the power supply (not shown) is similar and managed by a different value $K_{push}$, which generally determines the change in the output frequency with the change in the supply voltage $V_{DD}$. This concept is widely known as supply pushing.

The electronic device 20 also includes a power pre-amplifier (PPA) 41 and a power amplifier (PA) 36 downstream from the two mixers 32a, 32b. The outputs from the two mixers 32a, 32b is summed at the summer 37 before being input to the power pre-amplifier 41. The output from the power pre-amplifier 41 is input to the power amplifier 36. The power amplifier 36 may typically provide 2 Watts of output power to a radiating antenna 29. As will be appreciated by those skilled in the art, the output of the power amplifier 36 may include modulation data around a carrier frequency, whereas an oscillator driving the mixer(s) may be a continuous wave (CW) signal at the carrier frequency in a direct conversion transmitter. In some embodiments, the power pre-amplifier 41 may not be included or additional pre and/or power amplifiers and/or power amplifier drivers may be used.

The power amplifier 36 generates an aggressing signal that would otherwise generate an output pull of the VCO 34. The aggressing signal can be interpreted in several ways. One way is to recognize that the amplitude modulation of the signal at the output of the power amplifier 36 bounces the ground that is shared by the VCO 34. There is an additional coupling through the power supply path which is isolated by the rejection offered by a low-drop out voltage regulator (LDO) 51 and may be significant at highest output power levels. As will be appreciated by those skilled in the art, VCO pulling increasingly affects operation of components within the electronic device 20, and thus may negatively affect communications performance. This is generally due to the VCO frequency output feeding into the up-conversion mixers 32a, 32b that, in turn, feed the input of the power pre-amplifier 41, and, thus, creates a closed loop. Particular attention to power supply design and isolation of the power amplifier from other circuitry, for example, may reduce the effect on the communications performance.

When an aggressing signal is brought closer to the VCO 34, it pulls the VCO output frequency to follow the aggressing signal. There are several mechanisms described in literature that create the pulling of the VCO 34. The VCO 34 is generally a nonlinear circuit, and thus, it may down convert the aggressing signal and produce a down converted aggressing signal that modulates the input of the VCO over and beyond the control voltage forced by the PLL. This may cause an undesired disturbance for the PLL that it tries to counteract. However, while the PLL reacts, the output of the VCO 34 follows the aggressing signal and may cause exceeding of an emission spectrum at the output of the power amplifier 36, for example.

The aggressing signal moves the power and ground. On the supply side ($V_{DD}$), the LDO 51 is illustratively used to isolate the supply of the VCO 34. However, LDOs are not typically able to regulate the supply at the carrier frequency as they are built with relatively low gain bandwidth components in low power active devices. Accordingly, the protection on the supply side may be limited to a decoupling capacitor (not shown) placed directly on the supply of the VCO 34. Any capacitor typically does not provide increased protection due to the inductance of the wires that connect the supply of the VCO 34 to the power.

Moreover, there may be a physical size limitation to the amount of decoupling capacitors that may be placed within a limited space on an integrated circuit, for example, that includes the VCO 34 and power pre-amplifier 41. Coupling capacitors external to the integrated circuit (IC) including the components of the electronic device 20 typically do not help address this problem because bond wires are inductive and provide significant impedance at the RF carrier frequencies. Hence, the VCO 34 may have limited protection by the decoupling capacitor and by the PLL itself. As will be appreciated by those skilled in the art, typically, the board layout should be such as to reduce the inductance and resistance from the supply of the VCO 34 to external power. It is highly desirable that the ground seen by the VCO 34 is as close to a ground seen by the power amplifier 36 as possible. To address this, grounding layers on the IC level, package substrate level, and PCB level are increased, while very short traces are used to extend from the IC, for example, to the power amplifier 36. This becomes increasingly difficult when considering multi-mode, multi-band radios that use several power amplifiers and external components. The power amplifiers may also have to be electromagnetically shielded by placing them in individual metal enclosures or cans that occupy limited board space on small form-factor phones, for example.

Other than the time consuming approach of multiple board revisions of an electronic device and the chip substrate improving isolation step by step, approaches to address this problem using an intelligent controller, for example, may be desirable.

To address the VCO pulling caused by the aggressing signal, the electronic device 20 includes a VCO pulling compensation circuit 60 coupled to the input 31 and the VCO 34. The VCO pulling compensation circuit 60 is configured to compensate the VCO 34 for the output pull based upon the baseband input signal TXI, TXQ and the aggressing signal.

The VCO pulling compensation circuit 60 illustratively includes a controller 61 and a digital-to-analog converter (DAC) 62 coupled thereto. The controller 61, may be a baseband processor or digital signal processor (DSP), for example, and advantageously "knows" the transmit output power. In other words, the amplitude of the baseband input signal TXI, TXQ is known. Accordingly, the controller 61 knows when the VCO pulling will be relatively high, and thus where compensation is desired.

The RE voltage swing at the output of the power amplifier 36 may create ground currents centered at the RF carrier frequency that may be coupled back to the supply and ground of the VCO 34. Additional electromagnetic coupling typically occurs between the antenna 29 and the VCO 34, for example, an inductor in the VCO when it is implemented using a tank circuit. Since the VCO 34 is generally a nonlinear circuit, some of the incident RF signal is down converted around DC to synthesize the aggressing signal and appears as an undesired noise signal at the input of the VCO for which counterbalancing is desired. Illustratively, the couplings may be interpreted as translating to the input of the VCO 34 as a down converted baseband signal that represents the RE envelope signal at the output of the power amplifier 36 and its higher order powers. Different conversion gains may be responsible for determining the RF envelope and its higher order powers.

The PLL naturally rejects this noise, however, while it generally takes time for loop filter output to build up, the output of the PLL shifts from the stable carrier frequency location, which may exceed specifications on modulation spectrum, error vector magnitude (EVM), and maximum acceptable phase noise at various frequency offsets. It may also cause failure in meeting adjacent channel leakage ratios (ACLRs) due to transients, for example. A compensation signal, if injected in a correct phase, may reduce the instantaneous perturbation of the frequency at the output of the VCO 34 and allow the PLL to increasingly counter the perturbation by not allowing the low pass filter 42 output to build up first and then return to the initial value due to the PLL loop operation. The compensation signal bandwidth may be higher than the bandwidth of the PLL or other bandwidth regulation elements such as a DC-DC converter on the power supply. Such compensation signal may not even be "noticed" by the regulation loops and may essentially provide open loop compensation to the aggressing signal.

The aggressing signal amplitude generally varies with the envelope of the RF signal at the output of the power amplifier 36. Accordingly, a compensating signal may be applied since the output is known. If the phases of the compensating signal and the envelope of the RF signal at the output of the power amplifier 36 are matched (after calibration, for example), it may be possible to apply a baseband envelope signal, or VCO compensation signal, to counterbalance the signal that is responsible for pulling the VCO 34.

It is generally desirable that the VCO compensation signal have a relatively very low power and low noise outside the band of interest. Advantageously, this is achieved because the DAC 62 applies the VCO compensation signal with a bandwidth equal to the bandwidth occupied by the envelope signal. Outside this bandwidth, an attenuator 63 is used to attenuate the counter balancing signal power. In some embodiments, the attenuator 63 may not be used. A low pass filter 63 with a pass band allowing the envelope signal to pass through may be added to provide further rejection to noise outside the band of interest. This is practical because the power needed to cancel the aggressor or aggressing signal is generally relatively small compared to the peak-to-peak voltage swing that can be provided by the compensating DAC 62. Even a small aggressing signal at the input of the VCO 34 can degrade performance. Note the typical VCOs implemented in deep-submicron complimentary metal oxide semiconductor (CMOS) nodes have a $K_{vco}$ more than 100 MHz/Volt. Hence, 1 uV can move the output frequency by 100 Hz and affect the output spectrum as a noticeable degradation. Hence, a relatively very small power VCO compensation signal is desired to provide adequate cancellation. While the low pass filter and the attenuator 63 are illustratively separate components, the filter and attenuator may be included on a component or integrated circuit, or include additional components.

The VCO compensation signal is input to a summer 71 along with the output of the PLL, and more particularly, the output of the low pass filter 42. The summed PLL output and the VCO compensation signal are provided as input to the VCO 34. In other embodiments the VCO compensation signal may be applied at the input of the low pass filter 42 and/or one or both of the filter and attenuator 63 may not be used.

It is also possible to monitor the error signal at the input of the VCO 34. The error signal may be monitored by an analog-to-digital conversion of the error signal via the buffer 65 and analog-to-digital converter (ADC) 66 at the input of the VCO 34. The buffer 65 may be a baseband low-noise amplifier (LNA) that provides an amplified version of the signal at the VCO input minus a reference voltage (to subtract the DC signal at the VCO input). Hence, the buffer 65 may produce an amplified version of the AC signal at the input of the VCO 34. It is desirable that the ground of the buffer 65 be kept as close to the ground of the power pre-amplifier 41 on the chip or IC (and the power amplifier 36 outside the IC) as possible, as it can reject the DC component using a series capacitor, e.g., to provide the AC error signal. However, a preferred implementation uses a DC cancelling digital-to-analog converter (not shown) embedded inside the buffer 65 to subtract the DC part of the input signal. Before using the error signal, the DC may be lowered by applying an appropriate digital input to the embedded DAC such that the output of the buffer 65 does not clip due to its gain provided. Monitoring of this error signal may be particularly desirable when the power amplifier 36 is expected to pull the VCO 34 at a high output power. This signal path may be closed by the controller 61 to provide a reduced latency, increased bandwidth pulling compensation path. As will be appreciated by those skilled in the art, the compensating signal path may include analog components.

At a relatively low output power from the power amplifier 36, compensation for VCO pulling is not desirable as pulling of the VCO is not as great at a lower output power. Accordingly, the VCO pulling compensation circuit 60 may be configured to compensate the VCO 34 for the output pull when the baseband input signal TXI, TXQ has an envelope greater than a threshold. The threshold may be 3 dB-4 dB below the maximum output power, for example, where pulling becomes a concern.

The controller 61 may apply an algorithm that takes the amplitude of the input signal TXI, TXQ, and the error signal from the input of the VCO 34 as inputs and generates, as an output, the compensating signal. The algorithm may be programmable in the controller 61.

In some embodiments, the VCO pulling compensation circuit 60 includes a memory 67 coupled to the controller 61. The memory 67 stores a VCO pulling compensation table of compensation values corresponding to a given aggressing signal and/or operating condition such as, temperature, for example. The temperature may be available to the controller 61 through a temperature sensor (not shown), for example. The compensation table may include attenuation and/or delay compensation values, for example. The compensation values are used by the controller 61 to generate the compensation signal based thereon. Values in the compensation table may be updated with new and/or additional measurements. The algorithm applied by the controller 61 may be updated based upon the compensation values stored in the compensation table.

Indeed, as will be appreciated by those skilled in the art, the VCO pulling compensation circuit 60 is an intelligent control loop that computes and applies compensation directly to the VCO 34 to compensate or fight the aggressing signal. This control loop is formed through the feedback signal from the ADC 66 entering the controller 61 which uses it to adjust the gain and phase of the VCO compensation signal. When the gain and phase are adjusted correctly the VCO compensation signal cancels or offsets the aggressor, and the feedback signal read from the ADC 66 generally does not show any pulling. A proportional-integral control loop can optionally be used by embedding a proportional integrated controller (not shown) inside the loop that processes the error. Thus, VCO pulling related specification violations may be reduced, and board and chip and/or substrate design may be simplified, for example. This control loop may be activated only when desired, i.e. when transmitting relatively close to maximum output power. It may be operated in a open loop condition at times, feeding forward a compensation signal computed from the envelope signal from TXI and TXQ with an amplitude determined by previously examined error signal.

It should be understood by those skilled in the art that the components of the electronic device 20 may be implemented on a single chip or module, which may be carried by the PCB 22. Alternatively, the components may be carried by the PCB 22 and not packaged in a chip. Other packaging configurations will be appreciated by those skilled in the art.

Figure 3:
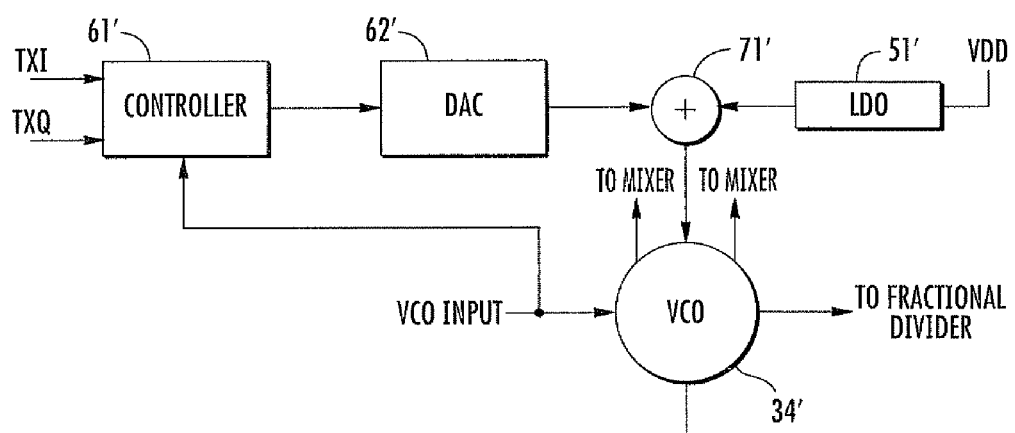
FIG. 3 is a schematic block diagram of a portion of an electronic device in accordance with another exemplary aspect.

Referring now to FIG. 3, in another exemplary embodiment, the VCO pulling compensation circuit 60' is configured to generate the VCO compensation signal at a power input of the VCO 34'. More particularly, a VCO compensation signal is generated from the controller 61' and is input to the DAC 62'. The output of the DAC 62' is input to a summer 71'. Output from LDO 51' is also input to the summer 71'. LDO 51' may alternatively be a DC-DC converter, or a switched mode power supply (SMPS), as will be appreciated by those skilled in the art. The summed result is provided to supply the VCO 36' as the VCO compensation signal. The signal forward fed has the adequate baseband signal for counter balancing the VCO pulling as the LDO or the DC-DC converter 51' typically cannot react to the high frequency envelope signal due to limitations of their internal bandwidths. Hence, the VCO compensation signal is fed in an open-loop manner independent of the power supply regulation loop.

Moreover, if filtering naturally occurs at the node where the compensation signal is applied, the applied signal may be pre-emphasized to cancel the effect of the filtering, i.e. if the compensation signal is low-pass filtered by the load, the inverse filtering (which pre-emphasizes higher frequencies to provide all-pass function within the band of interest) may be used in the digital domain to spectrally reshape the applied compensation.

Figure 4:
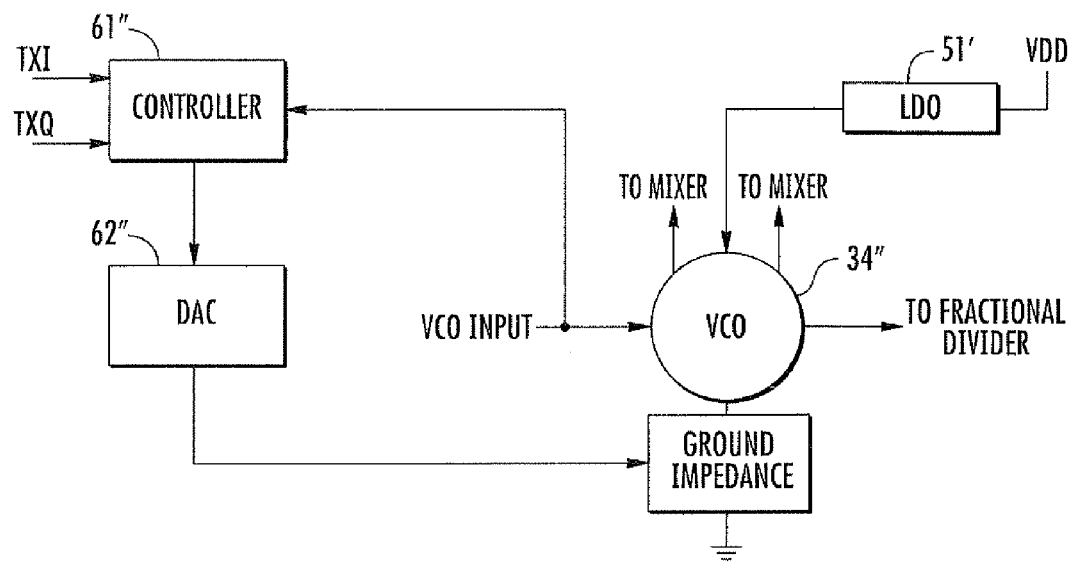
FIG. 4 is a schematic block diagram of a portion of an electronic device in accordance with another exemplary aspect.

Referring now to FIG. 4, in yet another exemplary embodiment, the VCO pulling compensation circuit 60" is configured to generate the VCO compensation signal at a ground of the VCO 34". More particularly, a VCO compensation signal is generated from the controller 61" and is input to the DAC 62". The output of the DAC 62" is provided at the ground terminal of the VCO 36". In this embodiment, the output of the DAC 62" is fed to the ground of the VCO 34" to create the VCO compensation signal or counterbalancing ground current that varies with the varying amplitude of the RF envelope.

Indeed, while in different exemplary embodiments the VCO compensation signal may be applied at the VCO supply, VCO ground, or VCO input, it will be appreciated by those skilled in the art that the VCO compensation signal may be applied at more than location, for example, a combination of any or all of the VCO supply, input, and ground, for example. In such a configuration, a multi-loop compensator may be used in which one loop provides counterbalancing at a time given the operating conditions or operating region (output power). The various loops can operate in tandem, i.e. one after the other, or some fixed to an open-loop operation, while one or more actively reduce the residual error.

Moreover, the VCO supply and the VCO ground may be considered a power input of the VCO 34. The VCO compensation signal may be applied at other locations.

A method aspect is directed to a method of compensating for an output pull of a VCO 34 of an electronic device 20 including an input 31 configured to receive at least one baseband input signal, at least one mixer 32 downstream from the input, a PLL including the VCO and a phase detector 44 coupled thereto. The VCO 34 is coupled to the at least one mixer 32, and the electronic device 20 includes at least one power amplifier 36 downstream from the at least one mixer 32 and generating at least one aggressing signal that would otherwise generate an output pull of the VCO 34. The method includes using a VCO pulling compensation circuit 60 coupled to the input 31 and the VCO 34 to compensate the VCO for the output pull based upon the at least one baseband input signal and the at least one aggressing signal.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

Exemplary components that may be used in various embodiments of the above-described electronic device are now described with reference to an exemplary mobile wireless communications device 1000 shown in FIG. 5. The device 1000 illustratively includes a housing 1200, a keypad 1400 and an output device 1600. The output device shown is a display 1600, which may comprise a full graphic LCD. In some embodiments, display 1600 may comprise a touch-sensitive input and output device. Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400 by the user.

In some embodiments, keypad 1400 may comprise a physical keypad or a virtual keypad (e.g., using a touch-sensitive interface) or both.

The housing 1200 may be elongated vertically, or may take on other sizes and shapes (including clamshell housing structures, for example). The keypad 1400 may include a mode selection key, or other hardware or software for switching between text entry and telephony entry.

Figure 5:
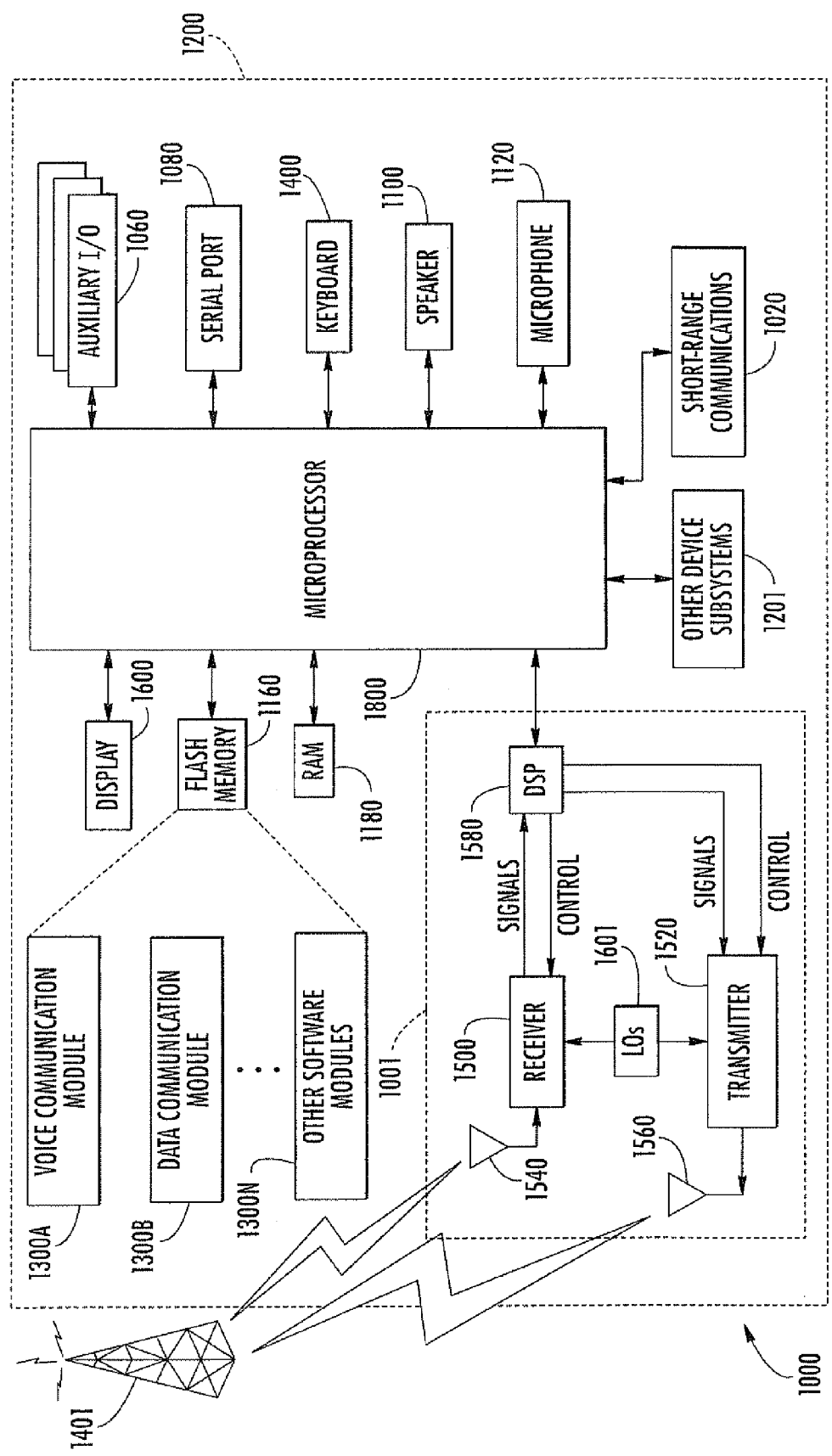
FIG. 5 is a schematic block diagram illustrating additional components that may be included in the electronic device of FIG. 1.

In addition to the processing device 1800, other parts of the mobile wireless communications device 1000 are shown schematically in FIG. 5. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having voice and data communications capabilities. In addition, the mobile device 1000 may have the capability to communicate with other computer systems via the Internet.

Operating system software executed by the processing device 1800 may be stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications or modules 1300A-1300N on the device 1000, such as software modules for performing various steps or operations. A predetermined set of applications that control basic device operations, such as data and voice communications 1300A and 1300B, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with the device user's corresponding data items stored or associated with a host computer system.

Communication functions, including data and voice communications, are performed through the communications subsystem 1001, and possibly through the short-range communications subsystem. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the Mobitex™, Data TAC™ or General Packet Radio Service (GPRS) mobile data communications networks, and also designed to operate with any of a variety of voice communications networks, such as AMPS, TDMA, CDMA, WCDMA, PCS, GSM, EDGE, etc. Other types of data and voice networks, both separate and integrated, may also be utilized with the mobile device 1000. The mobile device 1000 may also be compliant with other communications standards such as GSM, 3G, UMTS, 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore utilizes a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device user may also compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem may include an infrared device and associated circuits and components, or a Bluetooth™ communications module to provide for communication with similarly-enabled systems and devices.

That which is claimed is:

1. An electronic device comprising:
   an input configured to receive at least one baseband input signal;
   at least one mixer downstream from said input;
   a phase-locked loop (PLL) comprising a voltage controlled oscillator (VCO) and a phase detector coupled thereto, said VCO coupled to said at least one mixer;
   at least one power amplifier downstream from said at least one mixer and generating at least one aggressing signal that would otherwise generate an output pull of said VCO; and
   a VCO pulling compensation circuit coupled to said input and said VCO and configured to sample the at least one aggressing signal at a signal input of said VCO and compensate said VCO for the output pull based upon the at least one baseband input signal and the at least one aggressing signal.

2. The electronic device according to claim 1, wherein said VCO pulling compensation circuit is configured to generate a VCO compensation signal at the signal input of said VCO.

3. The electronic device according to claim 1, wherein said VCO pulling compensation circuit is configured to generate a VCO compensation signal at a power input of said VCO.

4. The electronic device according to claim 1, wherein said VCO pulling compensation circuit is configured to compensate said VCO for the output pull when the at least one baseband input signal has an envelope greater than a threshold.

5. The electronic device according to claim 1, wherein said VCO pulling compensation circuit comprises a controller and a digital-to-analog converter (DAC) coupled thereto.

6. The electronic device according to claim 5, wherein said VCO pulling compensation circuit further comprises a summer coupled to said DAC and said phase detector.

7. The electronic device according to claim 5, wherein said VCO pulling compensation circuit further comprises a memory coupled to said controller and configured to store a VCO pulling compensation table of compensation values corresponding to a given aggressing signal.

8. The electronic device according to claim 5, wherein said VCO pulling compensation circuit further comprises a filter and an attenuator coupled thereto between said controller and said VCO.

9. The electronic device according to claim 1, wherein said PLL further comprises a fractional divider coupled between an output of said VCO and said phase detector, and a low-pass filter coupled between said phase detector and said VCO.

10. An electronic device comprising:
    an input configured to receive at least one baseband input signal;
    at least one mixer downstream from said input;
    a phase-locked loop (PLL) comprising a voltage controlled oscillator (VCO) and a phase detector coupled thereto, said VCO coupled to said at least one mixer;
    at least one power amplifier downstream from said at least one mixer and generating at least one aggressing signal that would otherwise generate an output pull of said VCO; and
    a VCO pulling compensation circuit coupled to said input and said VCO and comprising a controller and a digital-to-analog converter (DAC) coupled thereto, said controller being configured to compensate said VCO for the output pull based upon the at least one baseband input signal and the at least one aggressing signal sampled at a signal input of said VCO;
    said controller also being configured to compensate said VCO for the output pull when the at least one baseband input signal has an amplitude envelope greater than a threshold.

11. The electronic device according to claim 10, wherein said VCO pulling compensation circuit is configured to generate a VCO compensation signal at the signal input of said VCO.

12. The electronic device according to claim 10, wherein said VCO pulling compensation circuit is configured to generate a VCO compensation signal at a power input of said VCO.

13. The electronic device according to claim 10, wherein said VCO pulling compensation circuit further comprises a summer coupled to said DAC and said phase detector.

14. The electronic device according to claim 10, wherein said VCO pulling compensation circuit further comprises a memory coupled to said controller and configured to store a VCO pulling compensation table of compensation values corresponding to a given aggressing signal.

15. The electronic device according to claim 10, wherein said VCO pulling compensation circuit is configured to sample the at least one aggressing signal at a signal input of said VCO.

16. A method of compensating for an output pull of a voltage controlled oscillator (VCO) of an electronic device comprising an input configured to receive at least one baseband input signal, at least one mixer downstream from the input, a phase-locked loop (PLL) comprising the VCO and a phase detector coupled thereto, the VCO coupled to the at least one mixer, and at least one power amplifier downstream from the at least one mixer and generating at least one aggressing signal that would otherwise generate an output pull of the VCO, the method comprising:
    using a VCO pulling compensation circuit coupled to the input and the VCO to sample the at least one aggressing signal at a signal input of said VCO and compensate the VCO for the output pull based upon the at least one baseband input signal and the at least one aggressing signal.

17. The method according to claim 16, wherein using the VCO pulling compensation circuit comprises generating a VCO compensation signal at the signal input of the VCO.

18. The method according to claim 16, wherein using the VCO pulling compensation circuit comprises generating a VCO compensation signal at a power input of the VCO.

19. The method according to claim 16, wherein using the VCO pulling compensation circuit comprises compensating the VCO for the output pull when the at least one baseband input signal has an amplitude envelope greater than a threshold.

* * * * *